United States Patent
Luff

(12) 
(10) Patent No.: US 6,456,168 B1
(45) Date of Patent: Sep. 24, 2002

(54) TEMPERATURE COMPENSATED CRYSTAL OSCILLATOR ASSEMBLED ON CRYSTAL BASE

(75) Inventor: Marlin Luff, Wheaton, IL (US)

(73) Assignee: CTS Corporation, Elkhart, IN (US)

( * ) Notice: Subject to any disclaimer, the term of this patent is extended or adjusted under 35 U.S.C. 154(b) by 0 days.

(21) Appl. No.: 09/751,206

(22) Filed: Dec. 29, 2000

(51) Int. Cl.⁷ .............. H03B 5/04; H03B 5/36; H01L 41/053; H05K 7/02
(52) U.S. Cl. ........... 331/68; 331/158; 331/176; 331/44; 310/348; 361/728; 361/820
(58) Field of Search ............... 331/68, 44, 69, 331/116 R, 116 FE, 158, 108 D, 176; 310/311, 348, 315; 361/752, 753, 757, 820, 728, 746, 747

(56) References Cited

U.S. PATENT DOCUMENTS

| | | |
|---|---|---|
| 4,609,883 A | 9/1986 | Mizumura et al. |
| 5,265,316 A | 11/1993 | Ikeda et al. |
| 5,438,219 A | 8/1995 | Kotzan et al. |
| 5,500,628 A | 3/1996 | Knecht |
| 6,229,249 B1 | 5/2001 | Hatanaka et al. |
| 6,229,404 B1 | 5/2001 | Hatanaka et al. |
| 6,239,669 B1 | 5/2001 | Koriyama et al. |

FOREIGN PATENT DOCUMENTS

| | | | |
|---|---|---|---|
| DE | 27 55 116 | * | 6/1979 |
| JP | 54-35870 | | 3/1979 |
| JP | 56043814 | | 4/1981 |
| JP | 5-55612 | | 7/1983 |
| JP | 59091719 | | 5/1984 |
| JP | 1-100959 | | 4/1989 |
| JP | 60-74659 | | 4/1989 |
| JP | 6140871 | | 5/1994 |

* cited by examiner

*Primary Examiner*—David Mis

(57) ABSTRACT

A dual-cavity temperature compensated crystal oscillator (100) provides a three-layer ceramic package (110), with a crystal (170) sealed in a well or cavity (148). Oscillator components (180–184) such as a compensation circuit and an oscillator are attached through screened solder onto the back side of the ceramic package (110) and are encapsulated within potting compound or encapsulant. Electrical connection is provided between the oscillator and compensation circuitry and the piezoelectric element (170) to produce a frequency-controlled oscillator. After frequency tuning, a hermetic seal is provided between a cover (160) and ledge (140) to hermetically seal the cavity (148).

13 Claims, 1 Drawing Sheet

TEMPERATURE COMPENSATED CRYSTAL OSCILLATOR ASSEMBLED ON CRYSTAL BASE

BACKGROUND OF THE INVENTION

1. Field of the Invention

This invention pertains to oscillators generally, and more specifically to housings or packages for temperature-controlled crystal oscillators that are simultaneously compact, rugged, and amenable to mass-production techniques.

2. Description of the Related Art

In a TCXO, electronic circuitry necessary to provide basic electrical oscillation and temperature compensation will most desirably be placed as close to the crystal as possible, since the temperature being measured will desirably be that of the crystal. The electronic circuit should also be close, owing to the high frequencies of oscillation which are adversely affected by long lead lengths. This has been accomplished in the prior art by including the electronic circuitry adjacent to the crystal, such as illustrated by Shigemori et al in U.S. Pat. No. 6,081,164. Unfortunately, the discrete package which is provided as important physical isolation for the crystal adds volume to the second package, making the finished oscillator quite large. Consequently, this design has not been widely accepted in the handheld marketplace.

Several additional designs, which are commonly owned by the present assignee, have been proposed that have proven to be successful in the marketplace. U.S. Pat. No. 5,438,219 to Kotzan and Knecht, and U.S. Pat. No. 5,500,628 to Knecht, the contents which are incorporated herein by reference for teachings found therein, each illustrate packages which accommodate oscillator and temperature control circuitry within a package which also separately houses a crystal resonator. The novel oscillator packages illustrated therein enabled the manufacture of a reliable package of smaller dimension than was previously possible, reducing the package size from 8.89 mm×8.89 mm×2.79 mm down to 7.11 mm×6.22 mm×2.24 mm. While those dimensions are already quite small, the demand continues for even smaller and lower cost components. Unfortunately, these patents also require that electrical connections be made within a package cavity. This eliminates the use of low-cost screened and re-flowed solder attachment, which is very amenable to high volume production, and instead requires alternatives such as wire-bonding to be used in a greater degree.

SUMMARY AND OBJECTS OF THE INVENTION

In a first manifestation, the invention is a temperature compensated oscillator assembled on a crystal package base. A planar substrate has first and second major surfaces forming opposite sides of the crystal package base. Sidewalls adjacent the first major surface extend upwardly therefrom and form a cavity therewith. The cavity is adapted to receive at least one piezoelectric component, and the second major surface is adapted to receive at least one electronic component. A cover is coupled to the cavity and defines a hermetic enclosure therewith. An encapsulant and the second major surface encapsulate the electronic component.

In a second manifestation, the invention is a method of coupling components to a crystal package. A ceramic package having an open receptacle with a planar exterior is provided. A piezoelectric element is mounted in the open receptacle. The piezoelectric element is frequency tuned, and then hermetically sealed in the open receptacle. Electronic components are affixed to the planar exterior and electrically coupled to the piezoelectric element.

In a third manifestation, the invention is a method for assembling a temperature compensated crystal oscillator. In this method, the steps are: providing a double-sided TCXO package body with a first planar surface and a cavity opposite the first surface; attaching compliant crystal supports into the cavity; placing a piezoelectric device into the crystal supports; hermetically sealing the cavity with a cover, applying a conductive composition onto the first planar surface; positioning electrical components into the conductive composition; affixing and electrically connecting the electrical components to the conductive composition; dispensing encapsulant substantially over the electrical components; and curing the encapsulant to yield an assembled TCXO.

Exemplary embodiments of the present invention solve the inadequacies of prior temperature compensated crystal oscillator circuits by providing a three-layer ceramic package with a crystal sealed in a well or cavity. Oscillator components are attached through screened solder onto the back side of the ceramic package and are encapsulated within potting compound or encapsulant.

A first object of the invention is to enable low-cost mass-production manufacturing techniques, while still ensuring the integrity of sensitive and critical parts within the oscillator. A second object of the invention is to provide a temperature compensated crystal oscillator (or other type of oscillator circuit) with output frequency that deviates less than +/−2 parts per million (ppm) over a temperature range of −30° to +85° C. Another object of the present invention is to provide a temperature compensated crystal oscillator with an output frequency that deviates less then approximately +/−1 ppm over a one-year aging period. A further object of the invention is to minimize the possibility of cross-contamination of the components by isolating the crystal from other components. Yet another object of the present invention is to provide a temperature compensated oscillator that may be packaged into a smaller package than was heretofore possible.

BRIEF DESCRIPTION OF THE DRAWINGS

Other objects, advantages, and novel features of the present invention can be understood and appreciated by reference to the following detailed description of the invention, taken in conjunction with the accompanying drawings, in which.

DESCRIPTION OF THE PREFERRED EMBODIMENT

Figure 1:
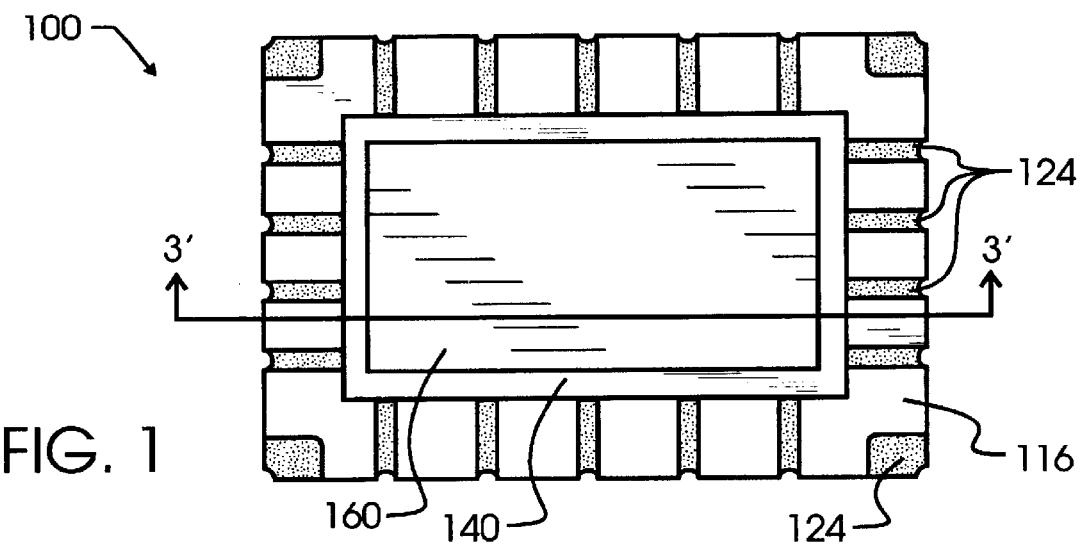
FIG. 1 illustrates the preferred embodiment temperature compensated crystal oscillator designed in accord with the teachings of the present invention from a bottom plan view.
Figure 2:
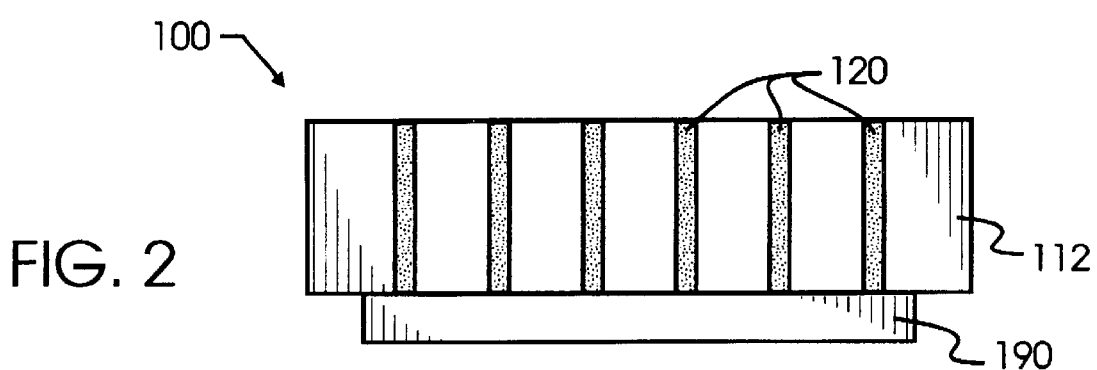
FIG. 2 illustrates the preferred embodiment temperature compensated crystal oscillator of FIG. 1 from a side plan view.

The present invention provides an improved dual-cavity temperature compensated crystal oscillator (TCXO) package 100. Within package 100 are included generally a compensation circuit and an oscillator coupled to a substrate. Package 100 receives a piezoelectric element 170 within cavity 148, and an electrical connection is provided between the oscillator and compensation circuitry and piezoelectric element 170 to produce a frequency-controlled oscillator. After frequency tuning, a hermetic seal is provided between cover 160 and ledge 140 to hermetically seal cavity 148. With preferred embodiment package 100, dimensional limitations of the prior art frequency control devices are substantially overcome.

The exact dimensions and geometry of package 100 can vary widely. Package 100 is particularly adapted for miniaturization, and may be shaped geometrically differently to accommodate differing design needs. The height of TCXO 100 will preferably be sufficient to enclose crystal 170 in cavity 148 and minimize stray or unwanted capacitances between piezoelectric element 170 and associated electronic circuitry. For example, package 100 may have dimensions of only 3.2 mm×5 mm×1.5 mm in one particular embodiment. As a result, package 100 is adapted for placement in an electronic device where it will typically take up a small portion of the total volume of the electronic device.

In the preferred embodiment, package 100 is most preferably manufactured from materials having substantially similar thermal expansion coefficients, to minimize stresses. Fired or co-fired ceramic materials such as alumina, produced for example through various casting or pressing techniques and having refractory, thick film or thin film metallizations, are suitable materials for body 110. These materials are preferred, owing to an intrinsic relatively low dielectric constant electrical insulation, moderate thermal conductivity, exceptional chemical, mechanical and environmental resistance including hermeticity, and a low thermal coefficient of expansion compatible with silicon and quartz. Nevertheless, myriads of materials exist that may also perform satisfactorily, as do myriads of processing techniques. Alloys of nickel, iron and cobalt sold under the trademark Kovar, or Alloy 42 and the like, but preferably Kovar because of its coefficient of thermal expansion being substantially similar to the preferred ceramic material of body 110, may preferably be used to fabricate cover 160.

Figure 3:
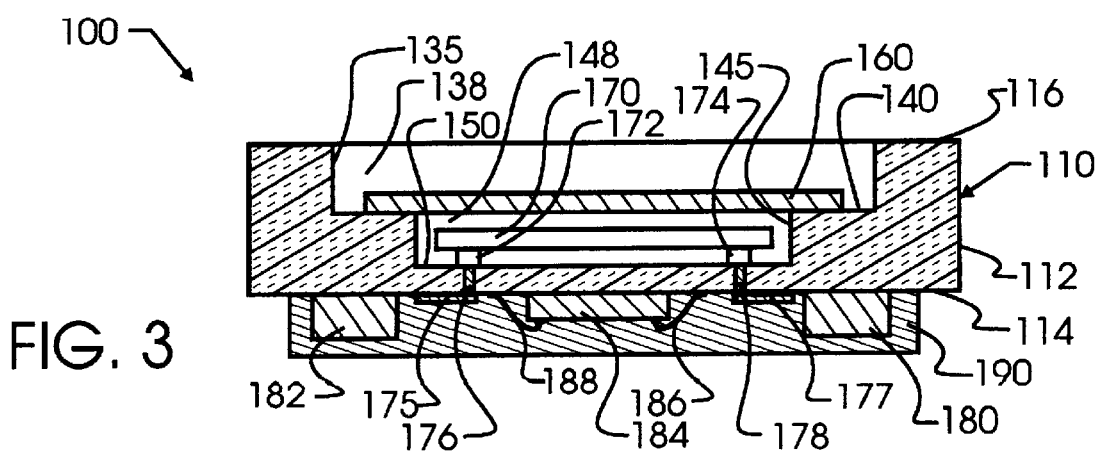
FIG. 3 illustrates the preferred embodiment temperature compensated crystal oscillator from a cross-section view taken along line 3' of FIG. 1.

Referring to FIG. 3, cavity 148 holds at least piezoelectric element 170 and can include other components if desired. However, having piezoelectric element 170 isolated from other components minimizes the possibility of contaminating element 170, which might otherwise result in undesirable frequency and performance changes. More particularly, isolating and physically separating piezoelectric element 170 in cavity 148 from components 180–184 on the exterior surface 114 substantially minimizes the possibility of the solder, organic underfill, and other unwanted contaminants from adversely affecting the output frequency of the piezoelectric element 170, which can occur over time in prior art TCXO's.

The geometric shape, size and composition of piezoelectric element 170 may vary depending upon the application, so long as it has the characteristics desired at design, such as a stable frequency output over a wide temperature range. Examples can include quartz AT-cut strip resonators, other cuts, shapes and compositions of bulk resonators, and even surface acoustic wave (SAW) devices. Nevertheless, quartz AT strip resonators are most preferred in the present invention owing to their inherent small size, photolithographic means of fabrication, light weight, good temperature stability and aging characteristics, and improved mechanical resilience due to a low mass. The AT-cut quartz strip further exhibits a well-behaved frequency versus temperature relationship from about −40° C. to about 90° C. that may be compensated for electronically.

Piezoelectric element 170 is mechanically supported on and coupled to couplings 172 and 174. Cantilever mounts, metal foil clips, or springs may be provided, or, alternatively, compliant materials may instead be used to form couplings 172 and 174. Regardless of composition or construction, couplings 172, 174 should provide a compliant electrical and mechanical connection. This allows piezoelectric element 170 and surface 150 to expand and contract at different rates without putting excess stress upon piezoelectric element 170, which in turn minimizes the possibility of undesirably changing the output frequency. As should be understood by those skilled in the art compliant materials as referred to herein can comprise various materials, so long as they are compliant and have a suitable viscosity so as to minimize the possibility of unwanted spreading or excessive flowing during application. Examples of compliant materials can include but are not limited to any one or more of the following: silver-filled silicone, silicone, epoxy, and silver-filled epoxy. Preferably, silver-filled epoxy is used for very good outgassing characteristics that only minimally degrade performance during aging while enclosed in the inert environment.

In an alternatively conceived embodiment, piezoelectric element 170 may be supported across ledges within cavity 148, and an electrical connection may be made therebetween. Care in placement is necessary in this embodiment so that piezoelectric element 170 sits across the ledges properly to suitably isolate the active region from the ledges. Otherwise there may be undesirable dampening and degrading of the frequency performance of TCXO package 100.

Electrically connected to couplings 172 and 174 are through-hole vias 176, 178 which are preferably co-fired, refractory metal or the like, for connecting piezoelectric element 170 to the circuitry on the opposing surface 114 of body 110. Through-hole vias 176, 178 interconnect the first major surface 150 of the base substrate of body 110 through to the second major surface 114. Surface 114 of body 110 supports various electronic components 180, 182, 184, and will preferable additionally include circuit traces formed thereon. These traces or wiring patterns may be formed by refractory metallization, thick or thin film, or other satisfactory processes. Wire bonds 186, 188 may be provided where needed, but more preferably the components placed upon surface 114 will be soldered into place. Most preferably, a solder paste will be screened onto surface 114, and components 180–184 will be placed therein. Then the solder will be reflowed in an oven, furnace or with other satisfactory technique to affix and electrically connect the components to surface 114. As an alternative to solder, conductive adhesives may be screened or otherwise provided and components 180–184 may be placed into the adhesive. The adhesive will then be cured, affixing and electrically connecting the components.

A glob top, conformal coating, encapsulant, molding or overmolding, or similar covering 190 will be applied after components 180–184 are affixed and electrically connected. One technique for potting or encapsulating the oscillator electronics is described in U.S. Pat. No. 5,640,746 to Knecht and Wille, commonly owned by the present assignee, which is incorporated herein by reference for teachings in that regard. Other techniques which are known generally in the electronics industry for encapsulation or potting are also considered to be incorporated herein as well.

After components are mounted and the encapsulant cured, TCXO package 100 is frequency tuned. This tuning may be accomplished, for example, by contacting tuning pads 175, 177 with appropriate equipment to determine the resonant frequency of element 170 and simultaneously adding or removing small amounts of mass. Mass loading of piezoelectric element 170 by adding mass decreases the frequency of resonance until a desired frequency is achieved, while removal of mass increases the frequency of resonance. Mass is typically added by either adding metal or other atoms through various metallization techniques, chemical reactions or oxidation of the electrode metal. Ion milling and other suitable techniques may be used for removal of mass. The possibility of unwanted metal or gasses contacting and adversely affecting other electronic components in cavity 148 during tuning is eliminated in the preferred embodiment because these components are isolated on the other side of body 110. Moreover, these additional components may not even be coupled to package 100 until the tuning step has been completed, depending upon the manufacturing sequence selected.

Next, cover 160, preferably comprising a metal such as Kovar, is welded, brazed or soldered onto metallization formed on ledge 140. A good weld can provide a seal to enclose an inert gas within cavity 148 or alternatively maintain a vacuum therein.

Once package 100 has been assembled, it may be electrically and mechanically coupled to a circuit board located in another device. Surface 116 of body 110 is configured to facilitate mounting onto circuit boards or similar substrates. A plurality of contacts 124 formed upon surface 116 are suitably connected to respective castellations 120, which are plated half holes or metallizations formed upon the exterior sidewalls 112 of body 110. As can best be seen in FIG. 3, a small cavity 138 is also provided which spaces cover 160 away from the circuit board. This helps to ensure that cover 160 will not form unwanted electrical contacts or short-circuits within the circuit board traces when contacts 124 are connected thereto, or mechanically interfere with the proper connection between contacts 124 and the circuit board.

Contacts 124 and castellations 120 may be formed from a variety of suitable techniques, including refractory metallization, thin or thick film, or other suitable techniques as are known in the art. The exact count or placement of contacts 124 and castellations 120 are not critical to the workings of the invention. However, contacts for DC power, ground and oscillator output are most preferred for the proper working and connection of the invention. A connection through which a voltage may be applied to adjust frequency will also preferably be provided. Other connections which are beneficial to the manufacture and testing of an oscillator may also be provided, in accordance with the needs of a particular embodiment at the time of design.

The method for making package 100 generally includes: (1) providing a double-sided TCXO package body 110; (2) providing compliant crystal supports 172, 174 appropriately onto surface 150; (3) placing quartz crystal 170 into cavity 140; (4) frequency tuning quartz crystal 170 by mass loading and removal, while actuating quartz crystal 170 electrically; (5) hermetically sealing cavity 148 with a metal cover, by placing and then sealing cover 160 with a seam weld, solder seal, compression weld or the like around a periphery thereof; (6) stenciling solder or conductive adhesive onto surface 114; (7) placing components 180–184 into the stenciled conductive; (8) reflowing the solder or curing the adhesive; (9) wire bonding, where necessary, any components to mating conductors on surface 114; (10) dispensing a glob top epoxy or encapsulant substantially over the components 180–184; (11) curing the encapsulant; and (12) testing the finished TCXO package 100. This process is particularly adapted for use in the mass production of temperature compensated crystal oscillators.

I claim:

1. A temperature compensated crystal oscillator assembled on a crystal package base adapted for surface mounting on a crystal side of said base, the oscillator comprising:

a planar platform having first and second major surfaces forming said crystal package base;

sidewalls adjacent said first major surface extending therefrom and terminating at a surface mountable end portion having a plurality of surface mount contacts, said sidewalls and said first major surface defining a cavity adapted to receive at least one piezoelectric component;

said second major surface being adapted to receive at least one electronic component;

a cover coupled to said cavity and defining a hermetic enclosure therewith; and an encapsulant and said second major surface encapsulating said at least one electronic component.

2. The oscillator of claim 1, wherein said second major surface is adapted to receive screen printed solder paste.

3. The oscillator of claim 1, wherein said second major surface is primarily covered by a curable material and further contains a wire bonded integrated circuit therein.

4. The oscillator of claim 1, wherein said at least one piezoelectric component is a quartz strip.

5. The oscillator of claim 1, wherein said extending sidewalls include electrically conductive castellations which carry electrical power, ground and oscillator output signals.

6. The oscillator of claim 1, wherein said cover comprises a metal.

7. The oscillator of claim 1, wherein said substrate and said extending sidewalls are composed of a ceramic.

8. The oscillator of claim 7, wherein said cover is composed of an alloy of nickel, iron and cobalt.

9. The oscillator of claim 1, wherein said substrate and said extending sidewalls comprise materials having substantially similar thermal expansion coefficients.

10. The oscillator of claim 1, further comprising a ledge formed on an interior surface of said extending sidewalls and spaced from said first major surface, upon which said cover may be mounted.

11. The oscillator of claim 10, further comprising a plurality of castellations extending from said second major surface along said extending sidewalls to said surface mountable end portion including a plurality of contacts adapted to facilitate connection to an electrical device, said plurality of electrical contacts electrically coupled to said castellations.

12. The oscillator of claim 1, wherein said cover is coupled to said extending sidewalls by a hermetic seal.

13. A method for manufacturing a temperature compensated crystal oscillator, comprising:

a) providing a ceramic package having a planar platform with first and second major surfaces, and having sidewalls adjacent said first major surface extending therefrom and terminating at a surface mountable end portion, said sidewalls and said first major surface defining an open receptacle adapted to receive a quartz strip;

b) mounting a quartz strip in said open receptacle;

c) frequency tuning said strip by adjusting mass loading while actuating the strip;

d) hermetically sealing said strip in said open receptacle;

e) mounting electronic components to said second surface; and f) encapsulating said electrical components to yield an assembled TCXO.

* * * * *